(12) United States Patent
Schafferer

(10) Patent No.: US 9,344,104 B1
(45) Date of Patent: May 17, 2016

(54) DIGITAL TO ANALOG CONVERTER AND ANALOG TO DIGITAL CONVERTER CALIBRATION TECHNIQUES

(71) Applicant: S9ESTRE, LLC, Amesbury, MA (US)

(72) Inventor: Bernd Schafferer, Amesbury, MA (US)

(73) Assignee: S9ESTRE, LLC, Amesbury, MA (US)

( * ) Notice: Subject to any disclaimer, the term of this patent is extended or adjusted under 35 U.S.C. 154(b) by 0 days.

(21) Appl. No.: 14/941,206

(22) Filed: Nov. 13, 2015

Related U.S. Application Data

(63) Continuation-in-part of application No. 14/280,574, filed on May 17, 2014, now Pat. No. 9,300,462.

(60) Provisional application No. 61/825,030, filed on May 18, 2013, provisional application No. 62/079,552, filed on Nov. 14, 2014.

(51) Int. Cl.
*H03M 1/06* (2006.01)
*H03M 1/10* (2006.01)
*H03M 3/00* (2006.01)
*H03M 1/68* (2006.01)
*H03M 1/00* (2006.01)

(52) U.S. Cl.
CPC ............ *H03M 1/066* (2013.01); *H03M 1/0658* (2013.01); *H03M 1/1014* (2013.01); *H03M 1/68* (2013.01); *H03M 3/32* (2013.01); *H03M 3/384* (2013.01); *H03M 3/50* (2013.01); *H03M 3/51* (2013.01); *H03M 1/002* (2013.01)

(58) Field of Classification Search
None
See application file for complete search history.

(56) References Cited

U.S. PATENT DOCUMENTS

| | | | | | |
|---|---|---|---|---|---|
| 4,580,126 | A | * | 4/1986 | Kato | H03M 1/109 341/120 |
| 5,153,592 | A | * | 10/1992 | Fairchild | H03M 1/1047 341/118 |
| 7,394,414 | B2 | * | 7/2008 | Briaire | H03M 1/0653 341/118 |
| 7,535,389 | B1 | * | 5/2009 | Teterwak | H03M 1/1042 341/118 |
| 7,868,794 | B2 | * | 1/2011 | Datta | H03M 1/1009 341/118 |
| 8,248,281 | B2 | * | 8/2012 | Nakamura | H03M 1/1028 341/117 |

* cited by examiner

*Primary Examiner* — Howard Williams
(74) *Attorney, Agent, or Firm* — Patterson Thuente Pedersen, P.A.

(57) ABSTRACT

Methods and devices for the calibration of digital to analog converters (DAC) and analog to digital converters (ADC) are disclosed. In a first step the DAC is calibrated and in a second step the calibrated DAC is used to calibrate the ADC. Averaging techniques and/or equation based techniques are used to further improve the calibration of both components in an iterative process. Embodiments of the invention allow for a very compact physical implementations of the converter. The invention reduces of analog circuitry in favor of digital circuits. Embodiments of the invention are suitable for the implementation in fine line CMOS processes and can operate in a low supply voltage environment.

20 Claims, 12 Drawing Sheets

$$\begin{vmatrix} M[0,0] & M[0,1] & .. & M[0,m] & R[0,0] & R[0,1] & .. & R[0,m] \\ M[1,0] & M[1,1] & .. & M[1,m] & R[1,0] & R[1,1] & .. & R[1,m] \\ . & . & .. & . & . & . & .. & . \\ . & . & .. & . & . & . & .. & . \\ M[n,0] & M[n,1] & .. & M[n,m] & R[n,0] & R[n,1] & .. & R[n,m] \\ 1 & 0 & .. & . & . & . & .. & 0 \\ 0 & 1 & .. & . & . & . & .. & 0 \\ . & . & .. & . & . & . & .. & . \\ . & . & .. & . & . & . & .. & . \\ . & . & .. & . & . & . & .. & . \\ 0 & 0 & .. & . & . & . & .. & 0 \\ 0 & 0 & .. & . & . & 0 & .. & 1 \end{vmatrix} * \begin{pmatrix} CM[0] \\ CM[1] \\ . \\ . \\ CM[m] \\ CR[0] \\ CR[1] \\ . \\ . \\ CR[m] \end{pmatrix} = \begin{pmatrix} A[0] \\ A[1] \\ . \\ . \\ A[n] \\ ECM[0] \\ ECM[1] \\ . \\ ECM[m] \\ ECR[0] \\ ECR[1] \\ . \\ ECR[m] \end{pmatrix}$$

DIGITAL TO ANALOG CONVERTER AND ANALOG TO DIGITAL CONVERTER CALIBRATION TECHNIQUES

CROSS-REFERENCE TO RELATED APPLICATION

This application is a Continuation-in-Part of U.S. patent application Ser. No. 14/280,574, filed May 17, 2014, entitled "Methods, devices, and algorithms for the linearization of nonlinear time variant systems and the synchronization of a plurality of such systems" which claims priority to U.S. Provisional Patent App. Ser. No. 61/825,030 filed May 18, 2013, and additionally claims the benefit of U.S. Provisional Patent App. Ser. No. 62/079,552 filed Nov. 14, 2014, the contents of each of which are hereby incorporated by reference.

TECHNICAL FIELD

The invention relates to the field of digital to analog (DAC) and analog to digital (ADC) converter. More particularly to the calibration of digital to analog and analog to digital converter using digital techniques.

BACKGROUND

Some applications require the integration of digital to analog converter and/or analog to digital converter together with digital circuits. Digital circuits consume less power and required less area in fine line CMOS process, i.e. processes below 100 nm. In many cases the choice of process technology is dictated by the constraints of the digital circuitry.

However, analog and mixed signals circuits, like DACs and ADCs, suffer from the poor matching performance and the low power supply voltages of fine line CMOS processes. Applying conventional DAC/ADC design techniques in fine line CMOS processes result in inefficient designs.

In the case of current steering DAC architectures the analog output is represented by the sum of unit segment currents. The unit segment currents are steered either to the positive or to the negative output of the DAC. The steering is achieved by switching elements that are controlled by signals derived from the DAC input signal. The matching of these unit segments determines the performance of the DAC. Performance parameters such as, integral non linearity (INL), differential non linearity (DNL) and spurious free dynamic range (SFDR) are affected. One method to calibrate a DAC is to equalize all the unit segments. With this method the unit segments are compared to a reference segment. Trim currents are added or subtracted to the unit segment currents such that their value is close to the reference segment currents. This can be done in a background mode or in dedicated calibration cycle during which the DAC is not producing an output signal. Another approach is digital pre distortion (DPD). With DPD, the unit segments are measured and new input codes for the DAC are calculated based on the measured values of the unit segments.

SUMMARY

Embodiments of the invention comprise digital techniques to calibrate DACs and ADCs. In a first step the DAC is calibrated and in a second step the calibrated DAC is used to calibrate the ADC. Equation based or averaging techniques can be used to calibrate the DAC. The initial accuracy of the analog circuit is not critical. Iterative bootstrapping is used to improve the accuracy over time. Embodiments of the invention allow for a very compact physical implementation.

Another aspect of the invention is the reduction of analog circuitry in favor of digital circuits. Digital circuits can be automatically generated from source code and therefore decreases the design time when porting the design into a new process technology. Embodiments of the invention can be implemented in low supply voltage environments.

The above summary of the invention is not intended to describe each illustrated embodiment or every implementation of the present invention. The detailed description and claims that follow more particularly exemplify these embodiments.

BRIEF DESCRIPTION OF THE DRAWINGS

Advantages of embodiments of the present invention will be apparent from the following detailed description of exemplary embodiments thereof, which description should be considered in conjunction with the accompanying drawing.

Figure 1A:
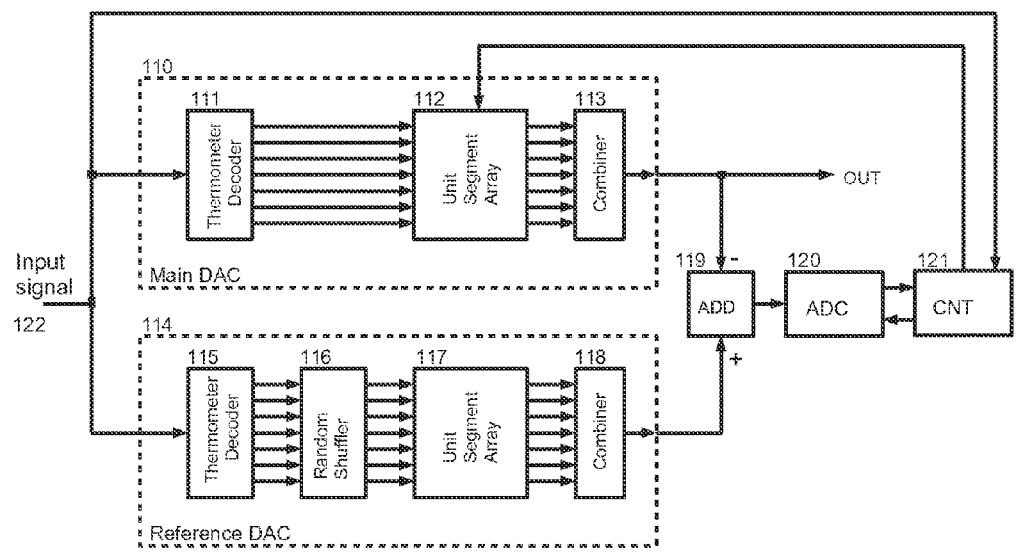
FIG. 1a is a schematic of a self-calibrating DAC/ADC configuration according to an embodiment.

While embodiments are amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION OF THE DRAWINGS

Figure 4A:
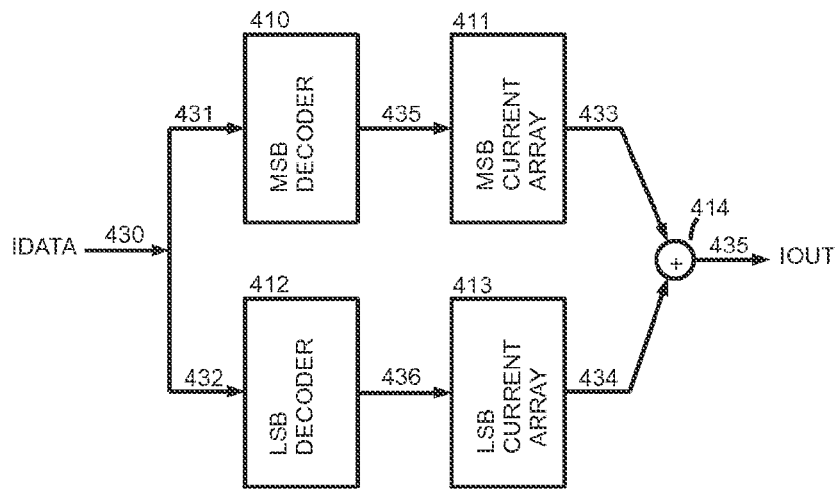
FIG. 4a is a schematic of a deterministic current steering digital to analog converter according to an embodiment.
Figure 4B:
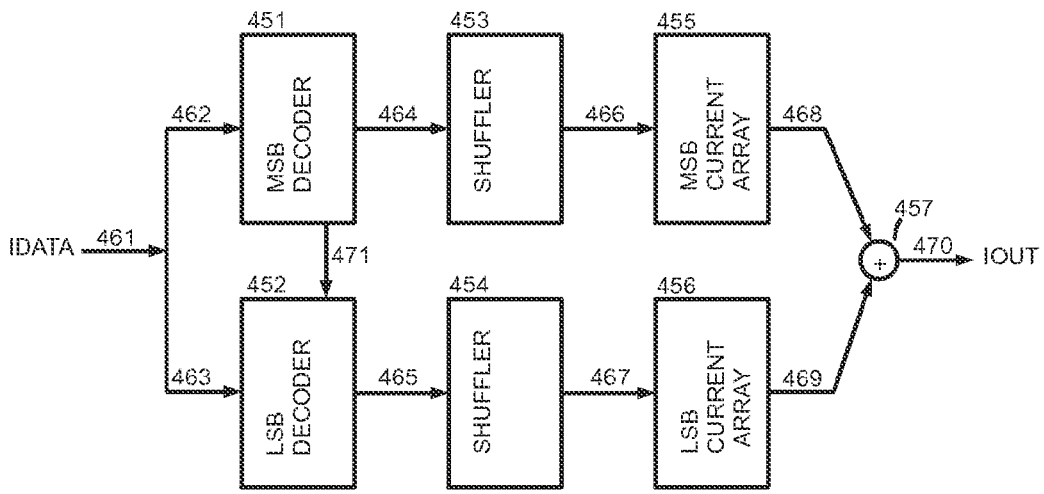
FIG. 4b is a schematic of a random shuffling current steering digital to analog converter according to an embodiment.
Figure 5:
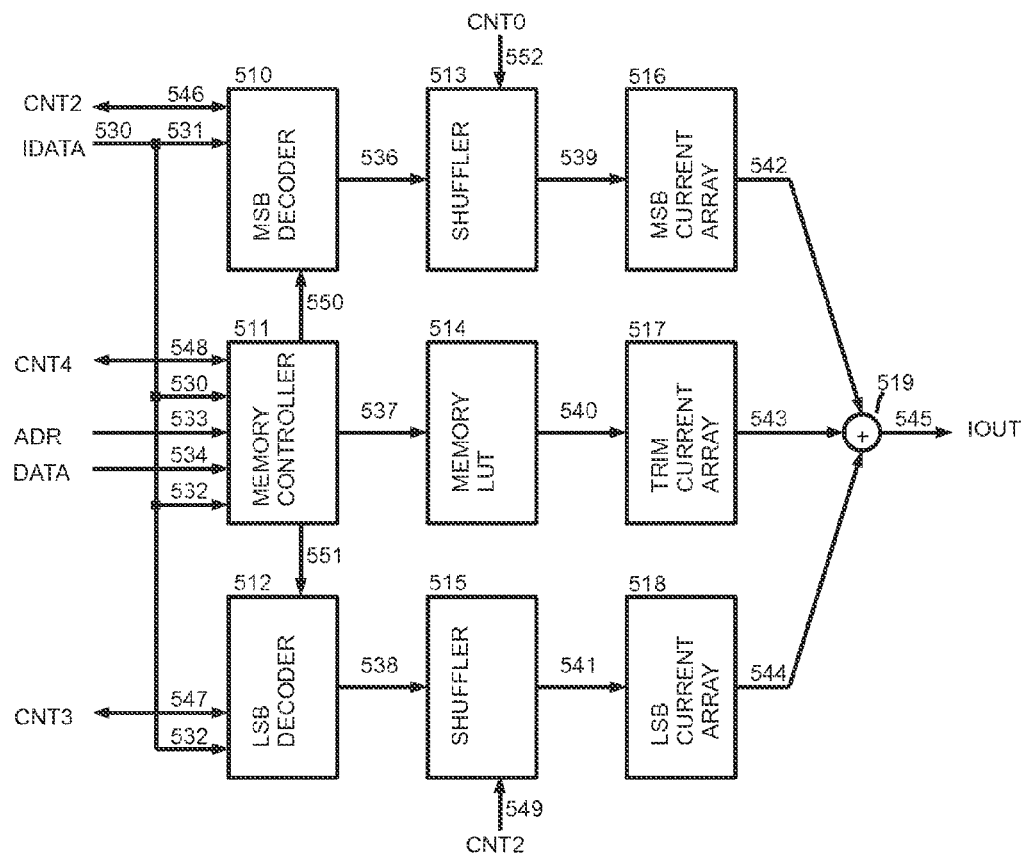
FIG. 5 is a schematic of an digital to analog converter with digital calibration according to an embodiment.

The following disclosure relates to the implementation of the Main DAC, Reference DAC, subtractor block and detector block of FIG. 4 and FIG. 5 of patent application Ser. No. 14/280,574, from which this application depends, the content of which has been incorporated by reference in its entirety. In the following description the subtractor block is replaced with an adder block, although one of ordinary skill in the art will recognize that in various alternative embodiments these blocks may be interchanged and/or combined with a variety of other components in order to perform a desired calibration.

The use of an adder block or subtractor block depends on the use of the output signal of the main DAC compared with the reference DAC. If, for example, the main DAC is implemented as a current source and the reference DAC as a current sink then a adder would be used. If both are implemented as either current source or current sink then a subtractor would be used. Further, the main and reference DAC can be implemented as differential circuits. In this case the determination of adder or subtractor is made whether the positive and negative outputs are combined or if the opposite polarity outputs are combined.

Figures 2A, 2B:
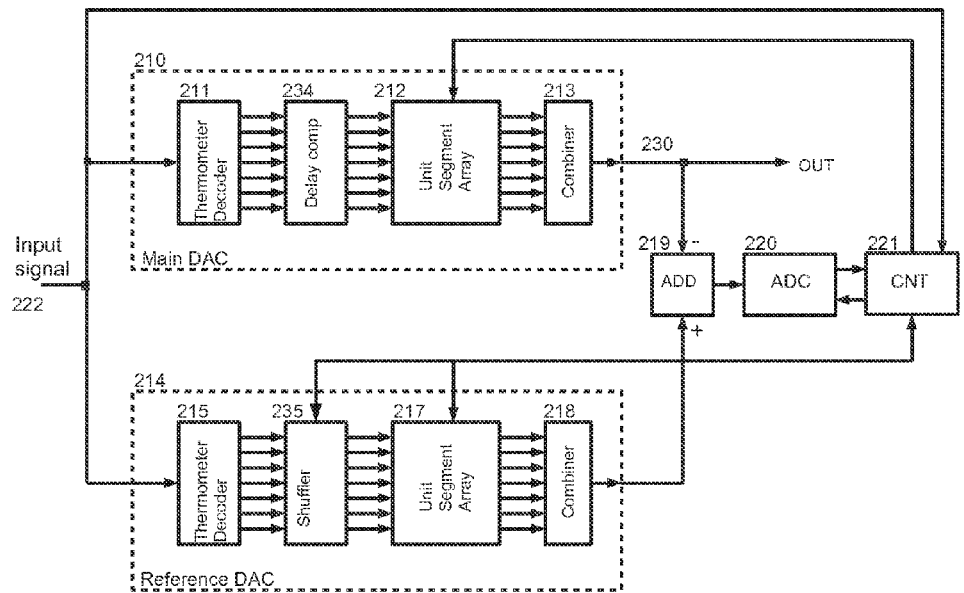
FIG. 2a is a schematic of a self-calibrating DAC/ADC configuration according to an embodiment.
FIG. 2b is a example set of equations to extract the estimate for the segment values according to an embodiment.

In FIGS. 1a and 2a both the main and the reference DAC receive the same digital input signals 122 and 222, respectively. However, the technology in which the main DAC is implemented might be different from the implantation technology of the reference DAC. This is the case when the output from the main DAC is used to drive a load signal which requires much more energy than the signal from the reference DAC and the main DAC has to be implemented in a technology which can sustain high voltages and/or current levels. The reference DAC on the other hand is implemented in a process technology which can be energy efficient, has smaller mismatch errors and/or is the same process technology as the digital circuitry in front of the DAC.

FIG. 1a shows an embodiment of a calibration scheme using an averaging method. The system consists of two digital to analog converter. The Main DAC 110 is build using unit segments. A thermometer decoder 111 converts the input sample 122 into a vector in which the number of one values is equal to the input sample, all other values in the vector are zero. In the unit segment array 112 the vector is associated with a unit segments. If the vector element of the associated unit segment is one, the segment will be routed to the combiner 113, if the vector element is zero the segment will not be send to the combiner 113. The combiner 113 adds all segments together and sends the sum to the output of the DAC, indicated as OUT in FIG. 1a. The thermometer decoder 111 activates always the same segments given the same input code. The Reference DAC 114, on the other hand, has a shuffler 116 between the thermometer decoder 115 and the unit segment array 117. The random shuffler generates a second vector based on the vector from the thermometer decoder 115. The second vector has the same number of one elements as the vector from the thermometer decoder 115, however, the position of the one elements within the second vector is randomly selected. That is, for the same input value 122 the second vector will look different. Since the likelihood that a specific segment is selected from the array is the same for all segments, by averaging many output samples the averaged output of DAC 114 approaches the correct value. The segments of the unit segment array 117 which are associated with the one values of the second vector are routed to the combiner 118.

Figure 1B:
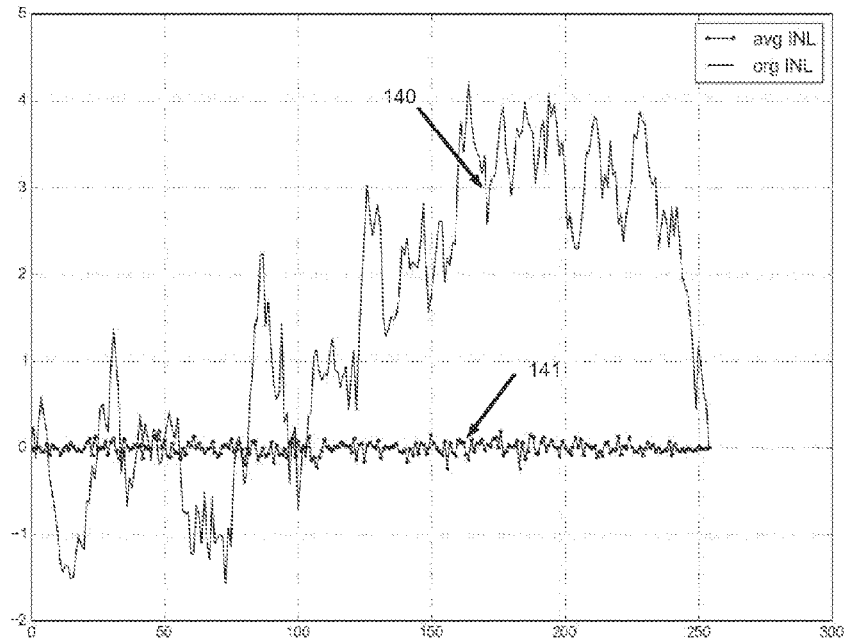
FIG. 1b is a DAC INL, with and without averaging, according to an embodiment.

FIG. 1b demonstrates the effect of averaging on the integral non-linearity (INL) of DAC 114. Trace 140 is the original INL of the DAC caused by the mismatch of the unit segments. Trace 141 is the averaged INL over 1000 runs. To use this averaging effect for calibration purposes, the output signals of the main DAC 110 and the Reference DAC 114 are subtracted using an adder 119 (as shown in FIG. 1a). The output of the adder 119 is then converted back into the digital domain by ADC 120. Controller 121 averages the output from the ADC 120 for a set of samples of the input signal 122. After a statistically significant number of samples for each code is collected, the controller calculates the values of the segments in the main DAC 110 and corrects the segment values in the main DAC 110. It is not shown, but understood, that the samples for the main DAC 110 and the reference DAC 114 must arrive at the same time at the adder 119. Additional delay elements in the main DAC 110 can be implemented to compensate for the additional delay due to the random Shuffler 116 in the reference DAC 114, in embodiments.

FIG. 2a depicts an embodiment of the calibration scheme using an equation based method. The main DAC 210 converts the digital input signal 222 into an analog output signal 230. The reference DAC 214 uses a shuffle block 235 to randomly alter the unit segments used from one input sample to the next. The output of the Main DAC 210 and Reference DAC 214 are subtracted by adder 219 and converted into a digital signal by the analog to digital converter 220. The controller 221 receives the input signals 222, the state of the Shuffler 235 and the output of the ADC 220. The controller 221 generates the system of equations as shown in FIG. 2b. M[s,c] is the bit used to activate or deactivate c'th segment in the unit segment array 212 of the main DAC 210. The index s refers the s'th input sample. Likewise, R[s,c] refers to the state of the c'th unit segment of the s'th input sample of the Reference DAC 214. CM[c] is the segment value of the c'th segment of the Main DAC 210. CR[c] is the segment value of the c'th segment of the reference DAC 214. A[s] is the readout of the ADC 220 for the s'th input sample. ECM[c] is the estimated segment value for the c'th segment of the Main DAC and ERC is the estimated segment value for the c'th segment of the Reference DAC. Standard mathematical techniques can be used to solve the system of equations. Based on the calculated values, the controller can adjust the segment values in the unit segment arrays 212 and 217. This procedure can be repeated using the results from the previous run as the estimates for the next run. In an ideal case, not considering noise or other distortions, the output code of the ADC 220 can toggle only between 2 values, therefore, the overall linearity of the ADC 220 is not important to the final result of the calibration. To further improve the accuracy of the system, the full scale range of the ADC 220 can be reduced from one run to the next run. The required range for a subsequent run can be estimated from the ADC output values. The calibration technique can be extended to digital to analog converter using a combination of different decoding schemes, like a combination of thermometer decoding and binary decoding.

FIG. 2a depicts an analog calibration. The controller adjusts the current sources of the main DAC and the reference DAC. However other techniques like a dedicated error correction DACs in parallel with the main DAC or digital pre-distortion techniques can be applied as well in various embodiments.

The equations in FIG. 2b assume linear superposition of the currents from the main DAC and the reference DAC. If this assumption cannot be made the matrix in FIG. 2b can be augmented to accommodate the expected error terms from a nonlinear superposition.

Figure 2C:
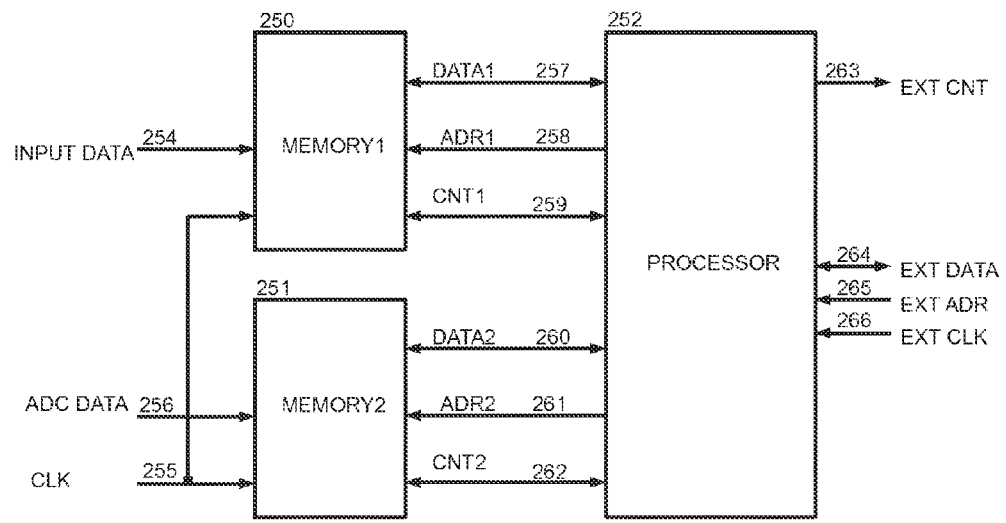
FIG. 2c is a schematic of a controller according to an embodiment.

FIG. 2c depicts an embodiment of the controller 221 of FIG. 2a. It comprises two memory blocks, 250 and 251. The Processor 252 can arm the memory blocks 250 and 251 with the control signals 259 and 262. Once armed, the memory blocks sequentially stores the incoming data 254 and 256 at each clock cycle of signal 255. If a set number of samples is reached the memory blocks reports back to the processor 252 that the memory is filled and ready for evaluation. The processor 252 will then read back the data from the memory via signals 257, 258, 259, 260, 261 and 262. The speed of the memory clock 255 and the external clock for the processor 266 can be different, depending on the converter speed and the evaluation speed of the processor 252. The controller can communicate with the converter and the rest of the environment via signals 263, 264, 265 and 266.

Figure 2D:
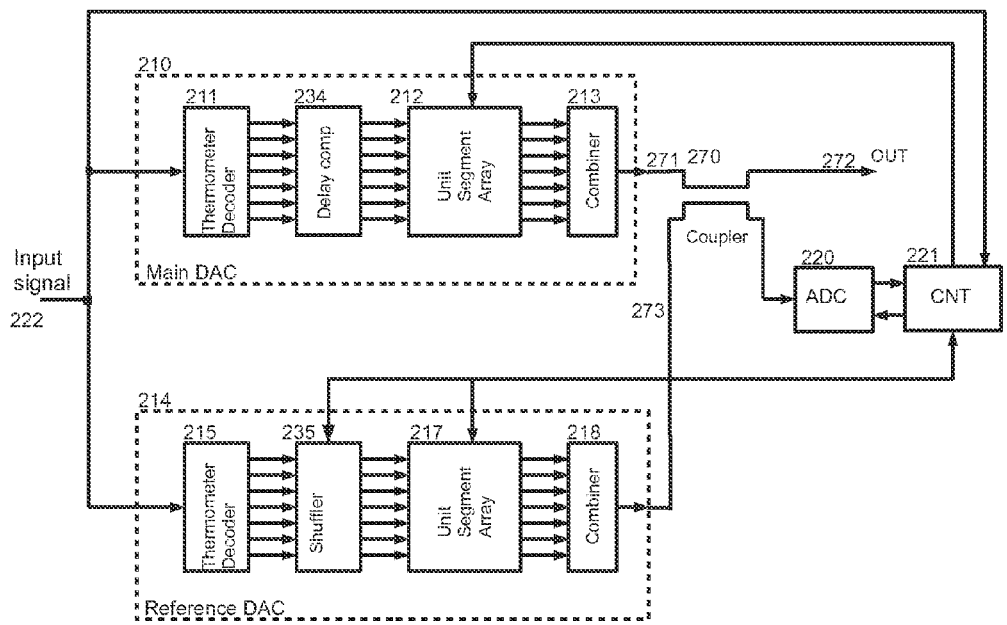
FIG. 2d depicts an embodiment of DAC/ADC calibration circuit including a transmission line transformer, according to an embodiment.

FIG. 2d depicts embodiment of DAC/ADC calibration circuit using a transmission line transformer 270. The transmission line transformer can be asymmetrical, that is, the path from the Main DAC 210 to the output 270 to the output 271 is a lower impedance path than the path from the Reference DAC 214. The coupling coefficient of the transmission line transformer determines the amount of energy the Reference DAC 214 has to provide to compensate for the energy delivered by the Main DAC 210 such that the combined energy flowing from the Main DAC 210 to the output and the energy from the Reference DAC 214 flowing to the ADC 220 cancel at the input of the ADC 220. The signals 271 and 273 have to complimentary in this case. This can be achieved by inverting the digital signal of the reference DAC 214 or building the reference DAC 214 such that it generated a complementary output signal with respect to the main DAC 210. Reflection coming back from the output 272 will by coupled onto the input of the ADC 220. However, the reflections are time-shifted with respect to the signal generated by the DACs and the controller can therefore distinguish between reflections and the DAC generated signals.

Figure 2E:
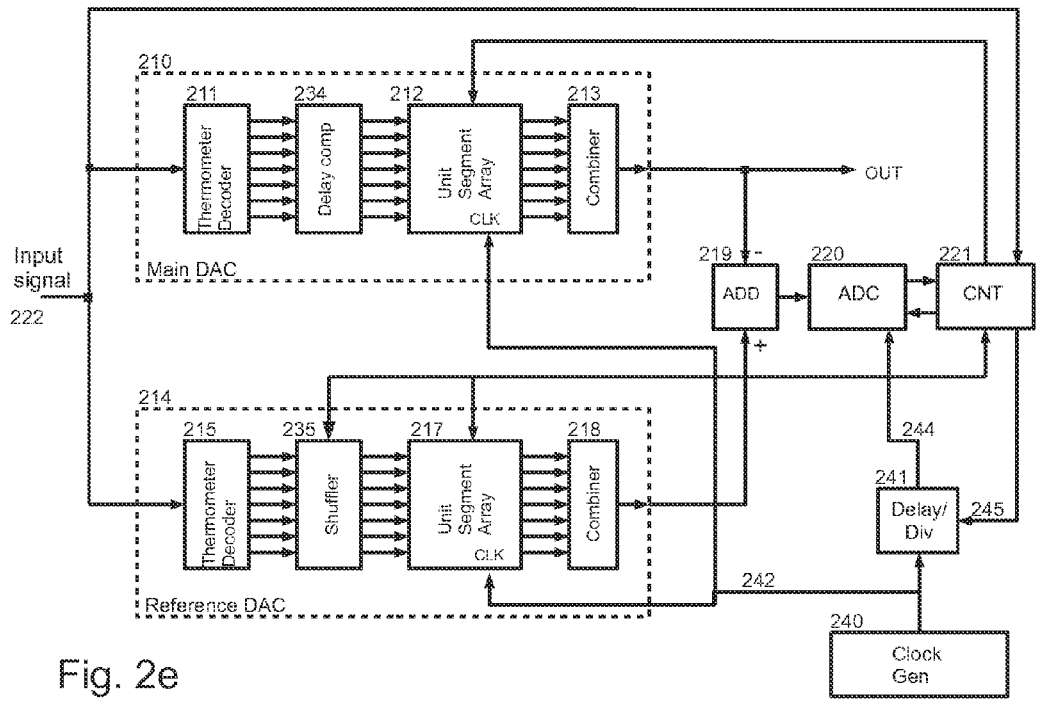
FIG. 2e depicts an alternative embodiment of a DAC/ADC calibration circuit.

FIG. 2e depicts embodiment of DAC/ADC calibration circuit with an alternative clocking scheme. A clock generator 240 generated the clocking signals 242 for the DACs. The clock signal for the ADC 244 is derived from a delay block 241. The delay block can either shift the clock 244 relative to the clock 241 or divide the clock to a lower frequency.

By sampling the system at different time points within a clock cycle the controller is able to collect more data of the system. This additional information can be used to estimate the segments errors. A sub-sampling system can be built by dividing the clock 242 down to operate the ADC at a lower sampling frequency. The reduced the sampling rate of the ADC can reduce the power consumption of the ADC and simplifies the ADC design.

Figure 3A:
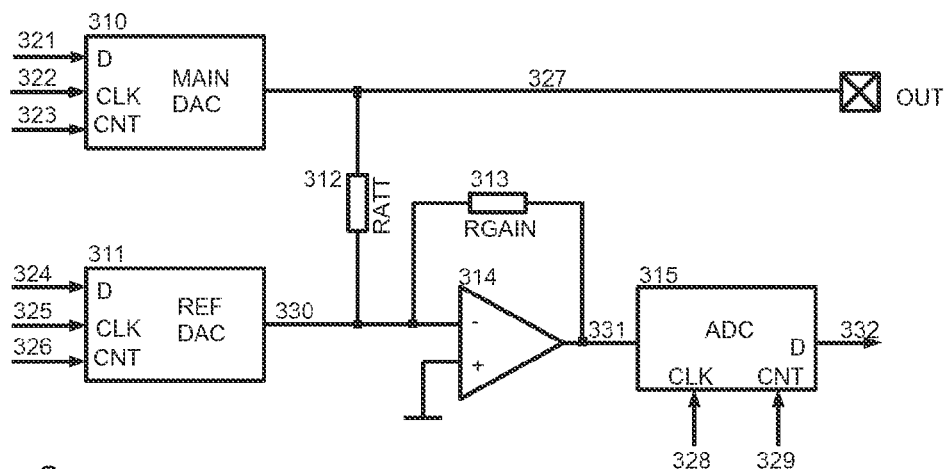
FIG. 3a is a schematic for a single ended implementation converter calibration circuit according to an embodiment.

FIG. 3a depicts a single ended embodiment of the converter calibration circuit. The Main DAC 310 and the Reference DAC 311 receive digital input data signals 321, 324 clock signals 322, 325, control signals 323, 326 and convert the digital input data signals into analog currents. The output current of the Main DAC 310 is converted into a voltage by an external load connected to the output 327. The output of the reference DAC 311 flows directly into a virtual ground node 330. The voltage difference between the output node 327 and the virtual ground node 330 forces a current through resistor 312 into the ground node 330. The current through the resistor is related to the voltage on the output node 327. The operational amplifier 314 establishes the virtual ground node 330 by forming a feedback system via the gain resistor 313. The sum of the currents flowing into the ground node 330 will be zero, hence the current through the gain resistor 313 is equal to the sum of the current from the reference DAC 311 and the current through resistor 312. The voltage on node 331 is proportional to the current through resistor 313. The ADC 315 converts the voltage of node 331 into a digital signal. If a current input ADC is used resistor 313 and operational amplifier 314 can be eliminated. In that case, the input of the ADC will function as the virtual ground node. Depending on the voltage difference between the virtual ground node 330 and the range of the output voltage 327 a constant offset current can flow through resistor 312. This offset current could shift the voltage 331 out of the input range of the ADC 315. A constant current can be fed in the virtual ground node to move the voltage on node 331 back to the center of the input range of ADC 315. FIG. 3a depicts a single ended embodiment, however, the whole circuitry of FIG. 3a can be implemented differentially, using differential DACs, ADC and operational amplifier.

Figure 3B:
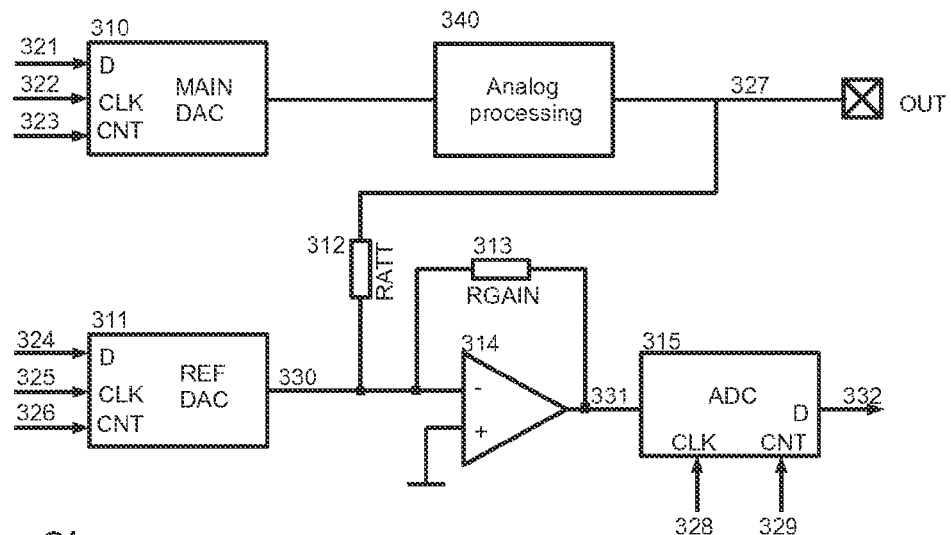
FIG. 3b is a schematic for a single ended implementation converter calibration circuit including an analog processing circuit according to an embodiment.

FIG. 3b depicts an embodiment of the converter calibration circuit with an analog processing circuit 340 in the loop. The analog processing circuit might be an amplifier or some other circuit which transforms the output signal domain of the main DAC to the required signal domain at the output node 327. The analog processing block 340 might exhibit undesired nonlinear behavior. By including the analog processing block 340 in the calibrations loop the calibration loop can reduce the nonlinear effects of the analog processing block. For this embodiment the digital data for the reference DAC 324 must be delayed such that the signals from the reference and main DAC 310 arrive at the same time at the virtual ground node. Alternatively, the output of the reference DAC 311 can be delayed to match the delay of the analog processing circuit 340.

FIG. 4a shows a typical implementation of a deterministic current steering DAC. The digital input signal 430 is split into two parts, the most significant bits (MSB) 431 and the least significant bit (LSB) 432. The most significant bits are thermometer decoded by decoder 410 while the least significant bits are routed straight through by decoder 412. The outputs of the decoder 410 and 412 controls the associated segments in the MSB current array 411 and LSB segment array 413. The currents of array 411 and 413 are added together to form the output current Iout 435. There are $2^{MSB}-1$ MSB-currents. The size of the MSB current is set to $IFSC/2^{MSB}$, where IFSC is the full scale current of the DAC. There are LSB LSB-currents. The current of the smallest LSB has a weight of $IFSC/2^{bit}$, the next smallest LSB is twice as big, and so on until the largest LSB which is half the current of an MSB segment.

FIG. 4b depicts an embodiment of the random shuffling current steering DAC. There are $2^{MSB}-1$ current sources. The size of the MSB currents is set to $IFSC/2^{MSB}$. After the thermometer decoder 451 is a shuffler 453. The shuffler is capable of routing the signals 464 to different positions of the signals 466. The swapping algorithm of the shuffler is pseudo random and reproducible by the controller 221. The outputs of the shuffler 453 control the associated currents in the MSB current array 455 in the same way as previously described with respect to FIG. 4a. The LSB decoder is also a thermometer decoder, decoding LSB input signals into $2^{LSB}-1$ output signals. The current of a LSB is set to $IFSC/2^{bit}$. To build a functioning DAC $2^{LSB}-1$ currents would be required. However the DAC in FIG. 4b uses $2^{(LSB+1)}-1$ LSB currents. The extra $2^{LSB}$ currents are switched on whenever the MSB decoder 451 activates signal 471. In this case the MSB decoder 451 will drop one MSB segment so that the total output is unchanged. After the MSB and LSB are processed by a shuffler 453 and 454 the shuffled MSB and LSB activate the corresponding currents in the current arrays 455 and 456.

The circuits of FIGS. 1a and 2a can use the DAC in FIG. 4b or similar embodiments to implement the Reference DAC 114 or 214, respectively. The decoding scheme and shuffling algorithm as well as the algorithm controlling the MSB/LSB exchange signal 471 must be known to the controller 221 of FIG. 2a so that the controller 221 can generate the equations of FIG. 2b. In current steering digital to analog converter the segments are implemented as switchable current sources. The output of the converter of FIGS. 4a and 4b is a current. However, other domains including but not limited to voltage, charge or electro-magnetic waves can be used instead of currents in various embodiments.

FIG. 5 depicts an embodiment of a DAC with build in digital calibration using a memory lookup table LUT 514. The input data 530 is split up into a MSB 531 and a LSB 532 path. The MSB path consists of blocks 510, 513 and 516. The LSB consists path of blocks 512, 515 and 518. The trim path consists of blocks 511, 514 and 517. The trim path is used during the calibration phase and the operation phase of the DAC. The output currents of the three paths 542, 543 and 544 are summed with adder 519 to form the output signal of the DAC 545. The shuffle blocks 513 and 515 are controlled from external controller via signals 549 and 552. Signals 549, 552 activate or deactivate the shuffling function and if asserted the shuffler is set in a known state such that the external controller can reproduce the shuffling sequence. The memory controller 511 can write data into LUT 514. The output of LUT 514 activates or deactivates the currents in the trim current array 517. With signal 550 the memory controller 511 can force the MSB decoder 510 to drop one of the activated MSB segments from its output. With signal 551 the memory controller 511 can force the LSB decoder 512 to drop one of the activated LSB segments from its output. The dropped currents will be replaced with currents from the trim currents array 517. Which currents of the trim current array 517 are selected as replacements current is determined by the contents of the memory look up table 514. For example, in calibration mode an external controller can write random patterns in the memory 514 via the memory controller 511. Once the external controller has determined the actual value of the currents in the MSB current array 516 and the LSB current array 518, the memory 514 can be loaded with the trim codes. The trim codes are calculated by selecting the best fitting currents of the trim current array 517 to the activated MSB or LSB currents. The memory controller 511 can detect which MSB and LSB are activated by monitoring the input data signal 530 and selecting the corresponding addresses in the look up table LUT 514 and, subsequently, the look up table LUT 514 activates the associated currents in the trim current array 517. This results in a mapping of the input data to the expected trim currents. Which trim currents are activated are store in the LUT 514.

Figure 6A:
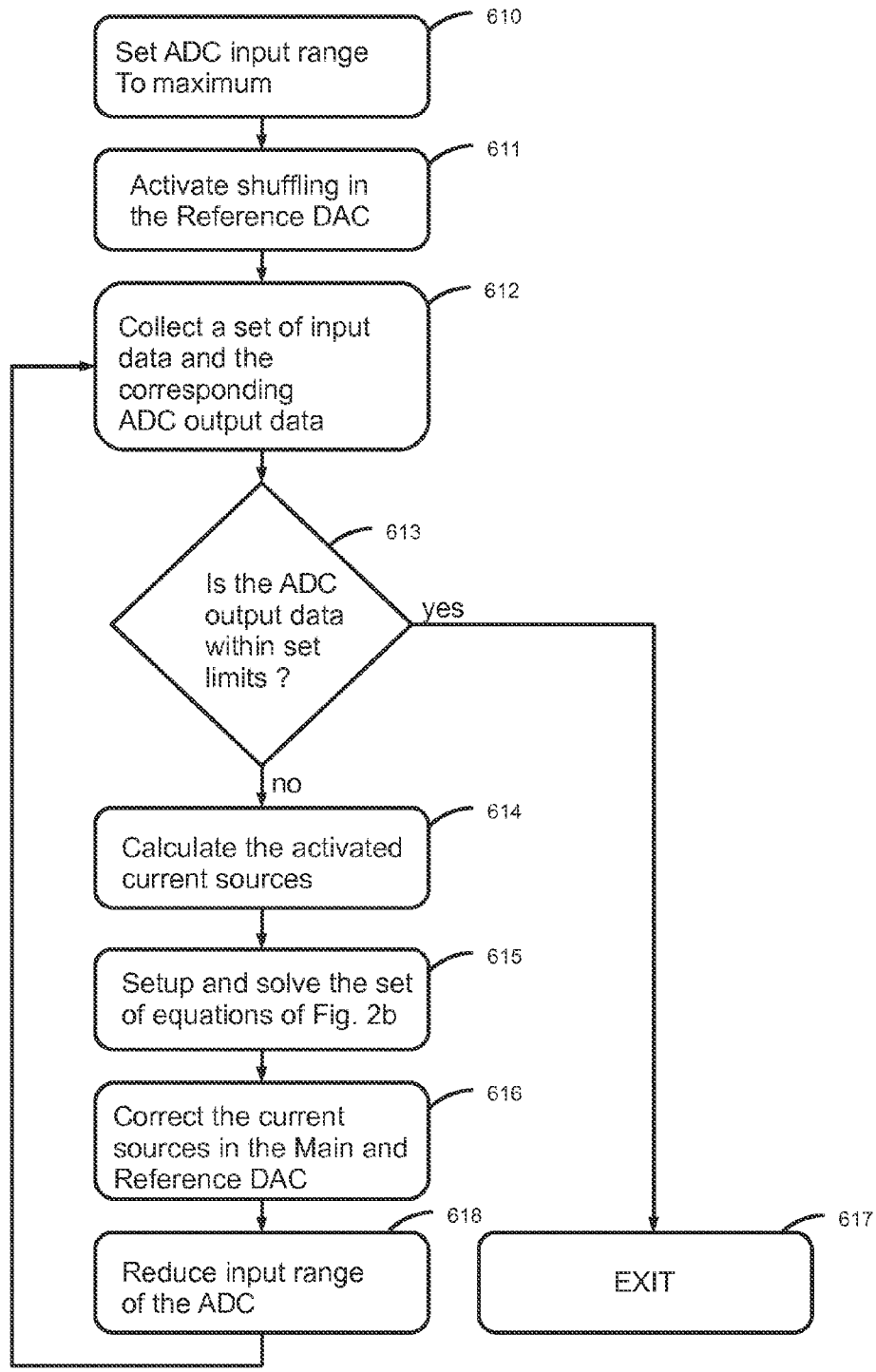
FIG. 6a is a flow chart of the equation based calibration algorithm according to an embodiment.

FIG. 6a depicts an embodiment of an equation based calibration algorithm for the controller 221 in FIG. 2a. At the beginning the input range of the ADC is set to a maximum or the maximum expected error between the Main DAC and the Reference DAC 610. The controller starts the shuffling feature in the Reference DAC 611. By knowing the input data and the state of the shuffler at a given input sample the controller can calculate the segments which were active for each input sample of the Main and Reference DAC. The error between Main DAC and Reference DAC is recorded by the ADC 612. If the outputs of the ADC are below a set limit the algorithm will terminate 613. If the outputs of the ADC are over the set limit the controller builds the set of equations according to FIG. 2b 614. Depending on the input data, not all segments of the Main DAC may be activated. In this case, the equation containing the missing segments can be removed from the set of equation or the missing segments values can be substituted with default values. Subsequently the controller solves the set equations 615 and corrects the segment values in the Main and Reference DAC 616. The error between the Main DAC and the Reference DAC is now expected to be smaller, hence the input range of the ADC can be reduced 618. The input range can be set to the minimum and maximum error of the current loop. If the algorithm converges the input range of the ADC approaches zero. However, this is not practical, therefore the input range will be limited such that the results of the ADC are still meaningful. In case the ADC is implemented as a FLASH ADC and the algorithm converges the ADC output might differ by only one count. That is, only one comparator of the FLASH converter is active and therefore the overall linearity of the ADC is irrelevant. Once the Main DAC and the Reference DAC are calibrated the system of FIG. 2a can be used to calibrate the ADC.

Figure 6B:
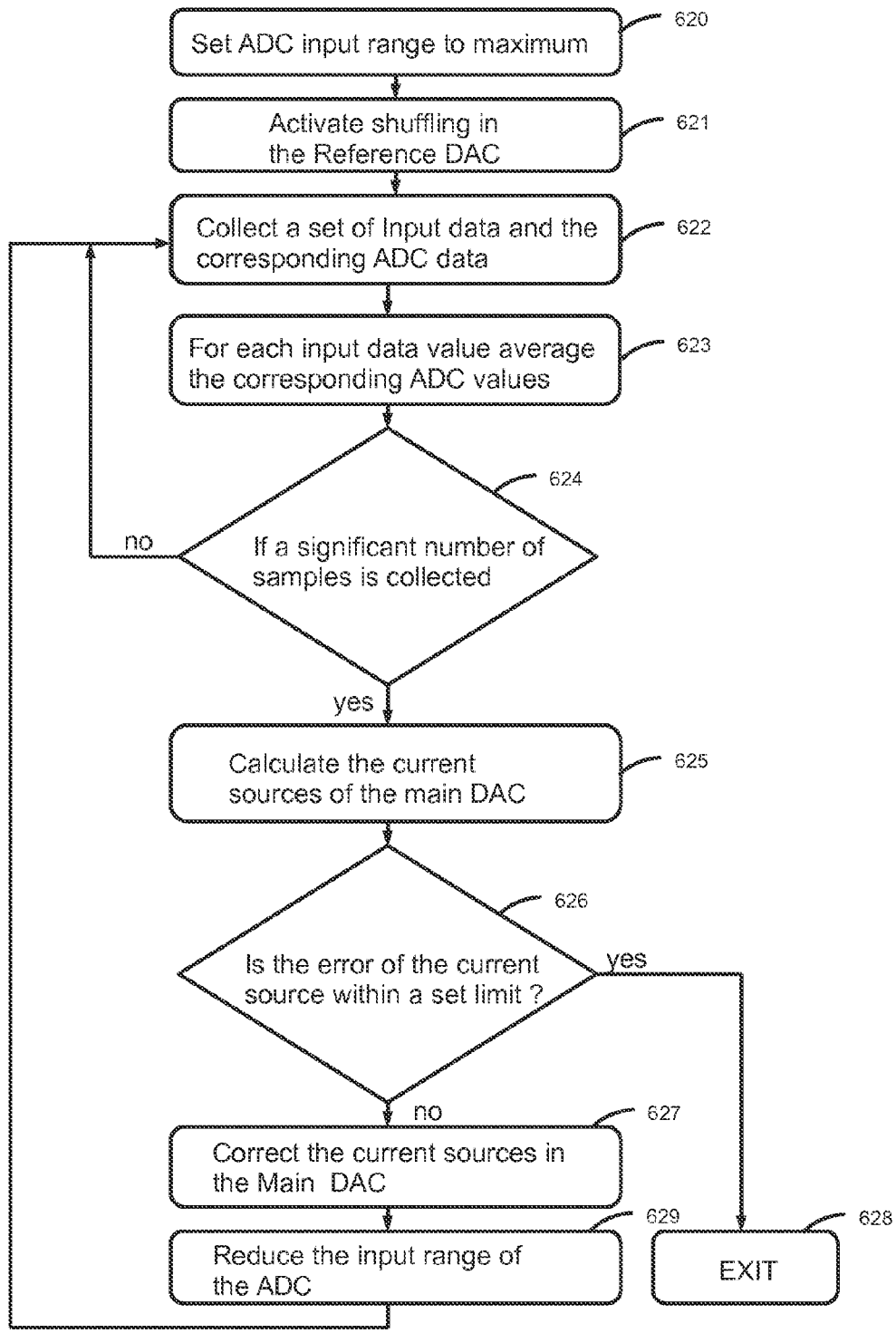
FIG. 6b is a flow chart of the averaging based calibration algorithm according to an embodiment.

FIG. 6b depicts an embodiment of an calibration algorithm based on an averaging method. This embodiment is not as computational expensive as the embodiment shown in FIG. 6a. The system collects a set of data input samples and ADC samples and stores them in a memory 622 while the reference DAC is set in shuffling mode 621. Once the memory is full the controller computes the average errors the ADC reported for each input value 623. This is repeated till a statistically significant number of samples for the input data values is collected 624. Data input values without a significant number of samples can be eliminated from the next step. From the averaged error values the controller can estimate the segment values of the Main DAC 625 and, in a subsequent step, correct the segment values in the Main DAC 627. If the segments errors are within a set limit the algorithm can terminate 628, otherwise the algorithm will collect another set of samples and repeat the segment error correction till the error limit is reached. Optionally, the input range of the ADC can be reduced after each loop in order to improve the measurement accuracy of the system 629.

Figure 7:
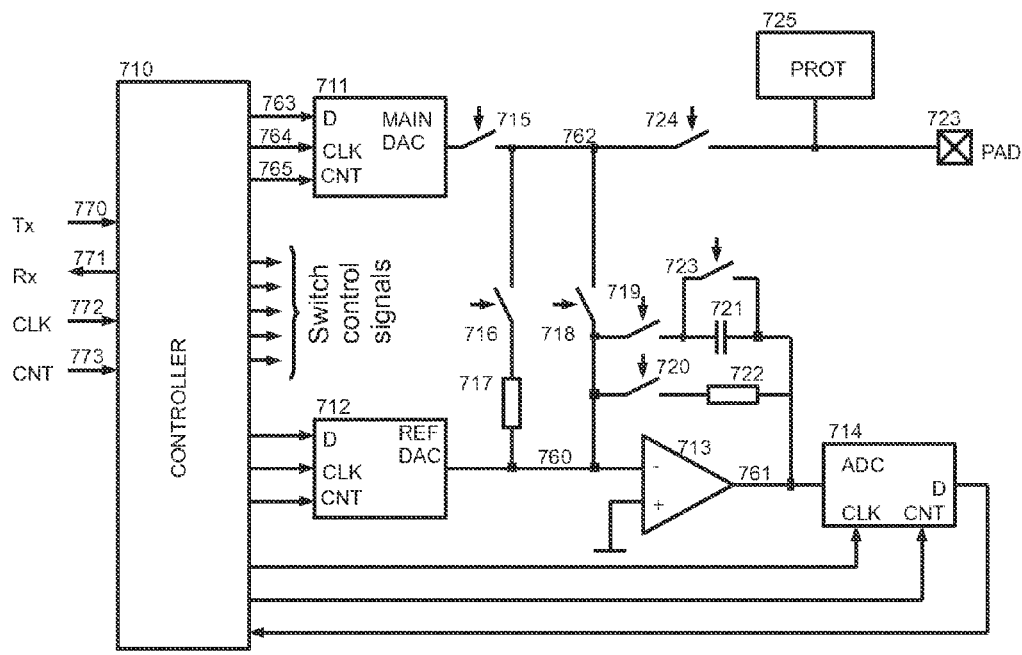
FIG. 7 is a schematic DAC/ADC converter combination according to an embodiment.

FIG. 7 depicts an embodiment of a converter PAD for integrated circuits. A single PAD 723 of an integrated circuit can be configured to operate as an analog output or analog input. The controller 710 is the interface between the converters 711, 712, 714 and the rest of the integrated circuit. Rx is the digital data from the ADC. Tx is the digital data which will be send out to the PAD 723 via the Main DAC 711. A clock signal 722 is provided for the sampling of the DACs, ADC and the clocking of the controller 710. In case the quality of the clock 772 is not sufficient for the requirements of the converter 711, 712, 714 a dedicated CLK signal for the converter 711, 712, 714 can be provided. A control signal 773 can be used to configure the circuitry and the converter. The linearity of the Main DAC 711 and Reference DAC 712 can be calibrated as described above. Once the Main DAC 711 and-or the Reference DAC 712 are calibrated the linearity of the ADC 714 can be calibrated using the Main DAC 711 or Reference DAC 712 as reference. The ADC 714 can be implemented as a low bit FLASH ADC. The ADC 714 can be directly connected via a switch to PAD 723. In FIG. 7, the ADC 714 is connected to the output of an inverting operational amplifier (OPAMP) 713. The negative input of the OPAMP 760 forms a virtual ground. A resistor 717 can be switched from the virtual ground to the PAD 723. The ratio of resistor 717 and 722 determines the gain of the OPAMP, and therefore, can be used to adjust the input range of the ADC 714.

Either resistor 717 or 722 can be made adjustable via switches adding parallel resistors on to resistors 717 and/or 722. The circuit in FIG. 7 can be configured as a sub-ranging ADC using the Reference DAC 712 or the Main DAC 711 to add a current into the virtual ground node, and therefore, offsetting the input range of the ADC 714. Optionally, the circuit can also be configured as a Dual Slope ADC using capacitor 721 as integration capacitor and the ADC as comparator. In this case one of the DAC 711 or 712 functions as current source during the reference phase of the dual slope ADC. However, integrating the integration capacitor 721 might not be practical. In that case, node 761 can be connected to a PAD and an external integration capacitor can be used. Using an external sample and hold circuit the circuit of FIG. 7 can be configured as a successive approximation ADC (SAR ADC) wherein the controller 710 is used the execute the approximation algorithm.

A multi-level delta sigma ADC can also be realized with the circuit of FIG. 7. The ADC 714 itself can be implemented as 4, 6, 8 bit FLASH ADC or SAR or pipeline ADC. The Main DAC 711 and the reference DAC can be implemented as current steering DAC. 8 to 10 bit DAC can be implements as thermometer decoded DAC while higher bit DACs in the range of 12-18 bit can be implemented as a combination of thermometer decoded and binary decoded DACs. Depending on the application the output currents of DACs 711 and 712 can be in the uA to mA range. The OPAMP 713 can be implemented as a standard multi stage differential amplifier or, in its simplest form, as a regulated cascode.

Figure 8A:
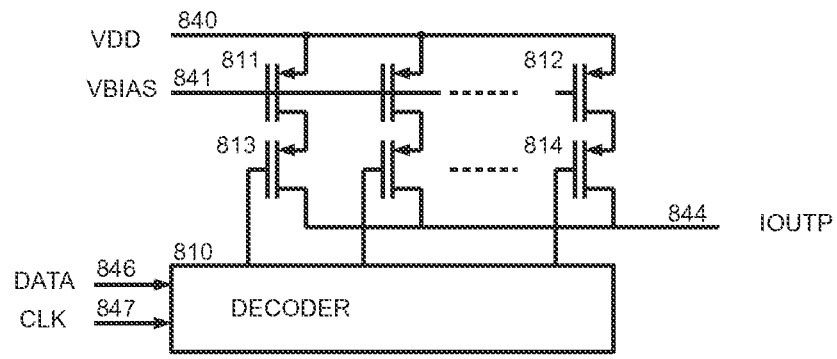
FIG. 8a is a schematic of current source DAC according to an embodiment.
Figure 8B:
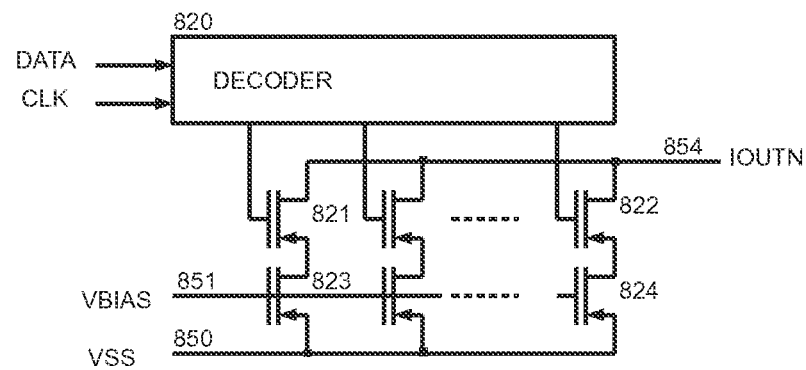
FIG. 8b is a schematic of current sink DAC according to an embodiment.
Figure 8C:
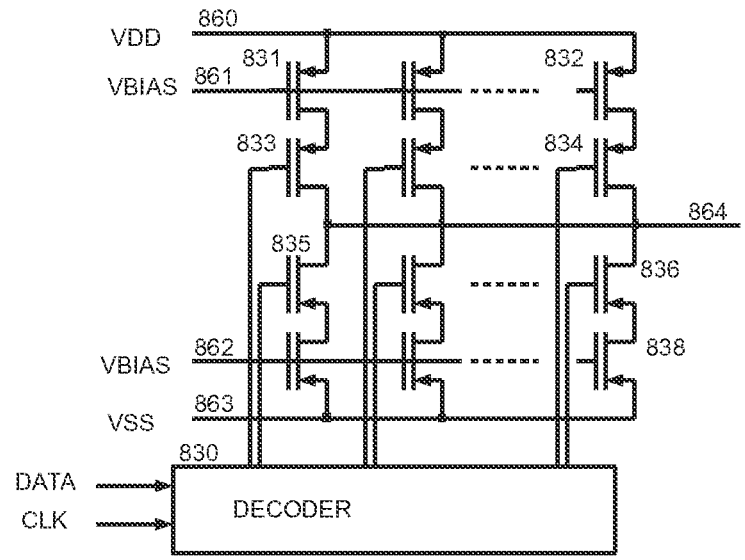
FIG. 8c is a schematic of current source and sink DAC according to an embodiment.

FIG. 8 depicts embodiments of the current source array of Main DAC and the Reference DAC. FIG. 8a shows a current source configuration. The decoder 810 activates the switches 813 to 814 according to the input data 846. The current through the transistors 813 to 814 is determined by the size of the transistors 811 to 814 and vbias 841. The full scale current of the DAC can be adjusted via vbias 841. FIG. 8b depicts a current sink implementation. FIG. 8c is a combined current source and current sink configuration. The expected output impedance of the DAC in FIG. 8 is much lower than in conventional DAC designs. However, in case of the Reference DAC 311 of FIG. 3, the DAC operates to a virtual ground. That is, the output voltage for the Reference DAC is not changing and therefore the output resistance of the Reference DAC 311 is in first order irrelevant. The Main DAC 310 of FIG. 3, however, has a changing output voltage. The current errors associated with the output voltage must be compensated during the calibration process. In order to avoid inter symbol interference the DACs in FIG. 8 can be implemented as return to zero DACs or interleaving return to zero DACs.

Figure 9A:
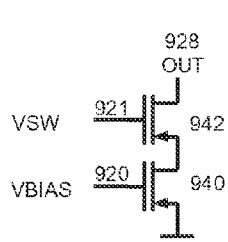
FIG. 9a is a schematic of switched current sink segment according to an embodiment.
Figure 9B:
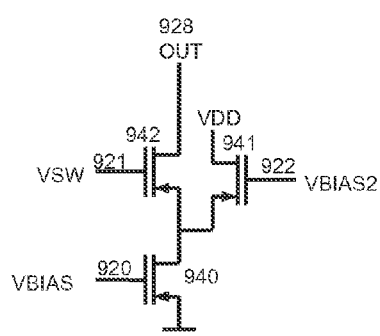
FIG. 9b is a schematic of switched current sink segment with uninterrupted current flow according to an embodiment.
Figure 9C:
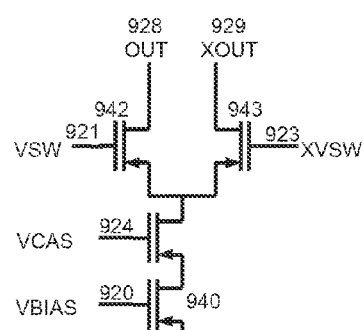
FIG. 9c is a schematic of standard current steering DAC segment.

FIG. 9a depicts the current sink segment configuration used in the FIG. 8. The bias voltage 920 sets, in first order, the current delivered to the output 928. An alternative current sink segment configuration is shown in FIG. 9b. In this configuration the total current is in first order independent of the switching voltage 921. If the current from transistor 940 is not routed to the output 928 the current is dumped via transistor 941. The voltage 922 on the gate of transistor 941 can be static, i.e. set to a value such that transistor 941 is conducting if transistor 942 is off, or switched with the complementary signal of signal 921. FIG. 9c depicts a classical current sink configuration of a DAC segment, using a current source transistor a cascode transistor and a differential switch.

While the foregoing written description of the invention enables one of ordinary skill to make and use what is considered presently to be the best mode thereof, those of ordinary skill will understand and appreciate the existence of variations, combinations, and equivalents of the specific embodiment, method, and examples herein. The invention should therefore not be limited by the above described embodiment, method, and examples, but by all embodiments and methods within the scope and spirit of the invention.

Various embodiments of systems, devices and methods have been described herein. These embodiments are given only by way of example and are not intended to limit the scope of the invention. It should be appreciated, moreover, that the various features of the embodiments that have been described may be combined in various ways to produce numerous additional embodiments. Moreover, while various materials, dimensions, shapes, configurations and locations, etc. have been described for use with disclosed embodiments, others besides those disclosed may be utilized without exceeding the scope of the invention.

Persons of ordinary skill in the relevant arts will recognize that the invention may comprise fewer features than illustrated in any individual embodiment described above. The embodiments described herein are not meant to be an exhaustive presentation of the ways in which the various features of the invention may be combined. Accordingly, the embodiments are not mutually exclusive combinations of features; rather, the invention can comprise a combination of different individual features selected from different individual embodiments, as understood by persons of ordinary skill in the art. Moreover, elements described with respect to one embodiment can be implemented in other embodiments even when not described in such embodiments unless otherwise noted. Although a dependent claim may refer in the claims to a specific combination with one or more other claims, other embodiments can also include a combination of the dependent claim with the subject matter of each other dependent claim or a combination of one or more features with other dependent or independent claims. Such combinations are proposed herein unless it is stated that a specific combination is not intended. Furthermore, it is intended also to include features of a claim in any other independent claim even if this claim is not directly made dependent to the independent claim.

Any incorporation by reference of documents above is limited such that no subject matter is incorporated that is contrary to the explicit disclosure herein. Any incorporation by reference of documents above is further limited such that no claims included in the documents are incorporated by reference herein. Any incorporation by reference of documents above is yet further limited such that any definitions provided in the documents are not incorporated by reference herein unless expressly included herein.

For purposes of interpreting the claims for the present invention, it is expressly intended that the provisions of Section 112, sixth paragraph of 35 U.S.C. are not to be invoked unless the specific terms "means for" or "step for" are recited in a claim.

I claim:
1. A signal processing circuit comprising:
a first digital to analog converter configured to receive an input signal and generate a corresponding output signal;
a second digital to analog converter based on a segmented architecture configured to receive the input signal an generate a corresponding reference signal;

a combiner configured to receive the output signal form the first and second digital to analog converter and generating a corresponding error signal;

an analog to digital converter connected to receive the error signal and generate a digital error signal; and a controller connected to receive the digital error signal and the input signal and generate at least one control signals, wherein each of the at least one control signals can be routed by the controller to one or more of the first digital to analog converter the second digital to analog converter, the combiner and the analog to digital converter, wherein the controller is configured to shuffle the segments in the second digital to analog converter between samples of the input signal.

2. The signal processing circuit according to claim 1, wherein the controller is configured to collect a set of samples from the digital error signal and the input signal and compute a correction signal for one or more of the first digital to analog converter, the second digital to analog converter, and the analog to digital converter.

3. The signal processing circuit according to claim 1, wherein the controller is configured to shuffle the segments in the first and/or second digital to analog converter, build a set of equations based a set of equations based on the segments activated in the first and second digital to analog converter and the associated digital error values over a set of input samples, and solves the equations for the segment values.

4. The signal processing circuit according to claim 1 further comprising:

a delay block; and a clock generator configure to provide a clocking signal the first digital to analog converter, the second digital to analog converter and the delay block;

wherein the delay block is configured to provide the clock signal for the analog to digital converter.

5. The signal processing circuit according to claim 1 further comprising:

a clock divider; and a clock generator configure to provide a clocking signal for the first digital to analog converter, the second digital to analog converter, and the clock divider;

wherein the clock divider is configured to provide the clock signal for the analog to digital converter.

6. The signal processing circuit according to claim 1, wherein the combiner includes a resistor coupled to the output signal and to a virtual ground node and configured to convert the output signal into an equivalent current flowing into the virtual ground node, and wherein the second digital to analog converter has a current domain output and the output of the second digital to analog converter is coupled to the virtual ground node and the difference between the equivalent current and the output current of the second digital to analog converter is use to drive the analog to digital converter.

7. The signal processing circuit according to claim 6, wherein the first and second digital to analog converters have differential outputs, the analog to digital converter has differential inputs, and the virtual ground node is differential.

8. The signal processing circuit according to claim 6, wherein the virtual ground comprises a trans-impedance amplifier, and wherein the difference between the equivalent current and the output current of the second digital to analog converter is converted to a voltage to drive the analog to digital converter.

9. The signal processing circuit according to claim 6, wherein the first digital to analog converter, the virtual ground, and the analog to digital converter are configured to function as one of a sub ranging analog to digital converter, a sigma delta analog to digital converter, and a dual slope analog to digital converter.

10. The signal processing circuit according to claim 1, wherein the first and/or second digital to analog converter has a pool of trim segments which are configured to be activated based on the input signal and a mapping function.

11. The signal processing circuit according to claim 1, wherein the first and/or second digital to analog converter is configured to:

receive an input sample having least significant bits (LSB) and at least one most significant bit (MSB);

generate an output current comprising a set of 2^MSB−1 MSB segments and a set of at least 2*2^LSB−1 LSB segments, each of the MSB segments and the LSB segments having either an activated or un-activated state; and replace a randomly selected activated MSB segment with 2^LSB un-activated LSB segments.

12. The signal processing circuit according to claim 1, further comprising an analog signal processing block configured to receive the output signal of the first digital to analog converter and generate the output signal.

13. A method of calibrating the linearity of a segmented digital to analog converter comprising:

converting with a first segmented digital to analog converter a digital input signal into an analog output signal, wherein the mapping of the input code to the activated segments is deterministic;

converting with a second segmented digital to analog converter the digital input signal into an analog reference signal, wherein the mapping of the input code to the activated segments is pseudo random;

forming an analog error signal by subtracting the analog output signal from the analog reference signal;

converting the analog error signal with an analog to digital converter into an digital error signal;

collecting a set of digital error signal samples and the associated input signals samples; and correcting the output of the first and/or second digital to analog converter based on the collected digital error signals.

14. The method of claim 13, further comprising the steps of:

recording the active segments for each input sample of the set of input samples for the first analog to digital converter;

recording the active segments for each input sample of the set of input samples for the second analog to digital converter;

forming a set of equations with the set of active segments from the first and second analog to digital converters and the set of error signals samples;

solving the set of equations for the segments values of the first and second digital to analog converter; and correcting the output of the first and/or second digital to analog converter based on the calculated segment values.

15. The method of claim 13, further comprising the steps of:

averaging the error signals for each input data code over a statistically significant set; and calculating the estimated segment values for the first digital to analog converter from the set of averaged error values.

16. The method of claim 13, wherein correcting the first and/or second digital to analog converter comprises implementing digital pre-distortion techniques.

17. The method of claim 13, wherein correcting the first and/or second digital to analog converter comprises modifying which of the segments are activated.

18. The method of claim 13, wherein correcting first and/or second digital to analog converter by adding at least one trim segment to the output based upon a mapping function.

19. The method of claim 13, further comprising calibrating the analog to digital converter by using the first and/or second digital to analog converter as reference.

20. The method of claim 13, further comprising forming a high resolution analog to digital converter by configuring the first digital to analog converter and the analog to digital converter to one of a sub-ranging, dual slope, delta sigma analog to digital converter.

* * * * *